United States Patent
Whipple et al.

(10) Patent No.: US 6,433,568 B1
(45) Date of Patent: Aug. 13, 2002

(54) MASSIVE PARALLEL SEMICONDUCTOR MANUFACTURING TEST PROCESS

(75) Inventors: Paul James Whipple; Judy A. Lanoux; Jayme W. Richard, all of Austin; Vincent V. Vu, Pflugerville, all of TX (US)

(73) Assignee: Motorola, Inc., Schaumburg, IL (US)

( * ) Notice: Subject to any disclaimer, the term of this patent is extended or adjusted under 35 U.S.C. 154(b) by 72 days.

(21) Appl. No.: 09/588,918

(22) Filed: Jun. 8, 2000

(51) Int. Cl.[7] .............................................. G01R 31/02
(52) U.S. Cl. ..................... 324/760; 324/158.1; 365/201
(58) Field of Search .............................. 324/760, 158.1, 324/73.1, 763, 765; 714/724; 365/201; 438/17, 18, 19

(56) References Cited

U.S. PATENT DOCUMENTS

| | | | |
|---|---|---|---|
| 4,926,117 A | * | 5/1990 | Nevill .................. 324/158.1 |
| 4,945,302 A | * | 7/1990 | Janum .................... 324/73.1 |
| 5,278,495 A | * | 1/1994 | Beaton et al. ........... 324/158.1 |
| 5,610,081 A | * | 3/1997 | Ping et al. ................... 437/8 |
| 5,796,246 A | * | 8/1998 | Poh et al. ................ 324/73.1 |

* cited by examiner

*Primary Examiner*—Michael Sherry
*Assistant Examiner*—Jimmy Nguyen
(74) *Attorney, Agent, or Firm*—James L. Clingan, Jr.

(57) ABSTRACT

A method of testing a plurality of integrated circuits each having a processing unit and an electrically programmable memory portion. The method includes providing a temperature cycling unit; inserting the plurality of integrated circuits in the temperature cycling unit; cycling the temperature in the temperature cycling unit through substantially room temperature, a first hot temperature, and a first cold temperature; performing a memory test protocol on the plurality of integrated circuits during the temperature cycling; removing the plurality of integrated circuits from the temperature cycling unit; providing an integrated circuit testing system which includes one or more testers; inserting a first relatively small number of the plurality of integrated circuits into one of the one or more testers; and performing a processor test protocol on the first relatively small number of integrated circuits at a temperature selected from substantially room temperature, a second hot temperature, and a second cold temperature.

20 Claims, 1 Drawing Sheet

MASSIVE PARALLEL SEMICONDUCTOR MANUFACTURING TEST PROCESS

FIELD OF THE INVENTION

The present invention relates to temperature cycling units and integrated circuit testing systems and, more specifically, to a massive parallel semiconductor manufacturing test process.

BACKGROUND OF THE INVENTION

Integrated circuit (IC) testing is divided into two main stages: package level burn-in and device testing. The package level burn-in is a 24 hour, 125 degree Celsius (C) process which performs device exercising. The package level burn-in is often referred to as a "package level test-in-burn-in" (PLTIBI) and utilizes a burn-in oven and an integrated burn-in environment (IBE) system that can exercise a relatively large number of about 1,248 devices simultaneously. A thousand may also be considered a large number. Since the package level hardware does not contain any external analog-to-digital converters, digital-to-analog converters, etc., the package level burn-in stage cannot perform functional testing on the device.

The device test stage is utilized to test the functional components of the device. The device test stage includes three steps that test the device at 25 degrees C (Celsius), 140 degrees C, and minus or negative 40 degrees C. The device test stage can only test a relatively small number of devices or ICs at a time. This may be as small as one per machine, but 32 can also be considered a small number. For example, testing the flash in a microprocessor device is a very lengthy process. Since there are many flash tests in the test stage, the time period per device is lengthy and increases test time dramatically. In efforts to overcome the delay, the hot testing of flash has been moved to the package level burn-in stage of the IC testing. However, cold testing is still performed at the test stage of the package level testing and contributes to undesirable delays in the IC testing.

In the first stage of the IC testing, during the burn-in, portions of an integrated circuit such as flash memory are only exercised, i.e., data is written into the memory, and testing does not occur at the burn-in stage of the IC testing. It would be a significant advantage if flash memory could be tested in parallel at the burn-in stage of the IC testing instead of being tested at the test stage. In this manner, time can be saved in the testing of each of the integrated circuits that are to be tested.

Upon viewing the present disclosure, those skilled in the art will understand that many other disadvantages exist in the prior art.

DETAILED DESCRIPTION OF THE DRAWINGS

Figure 1:
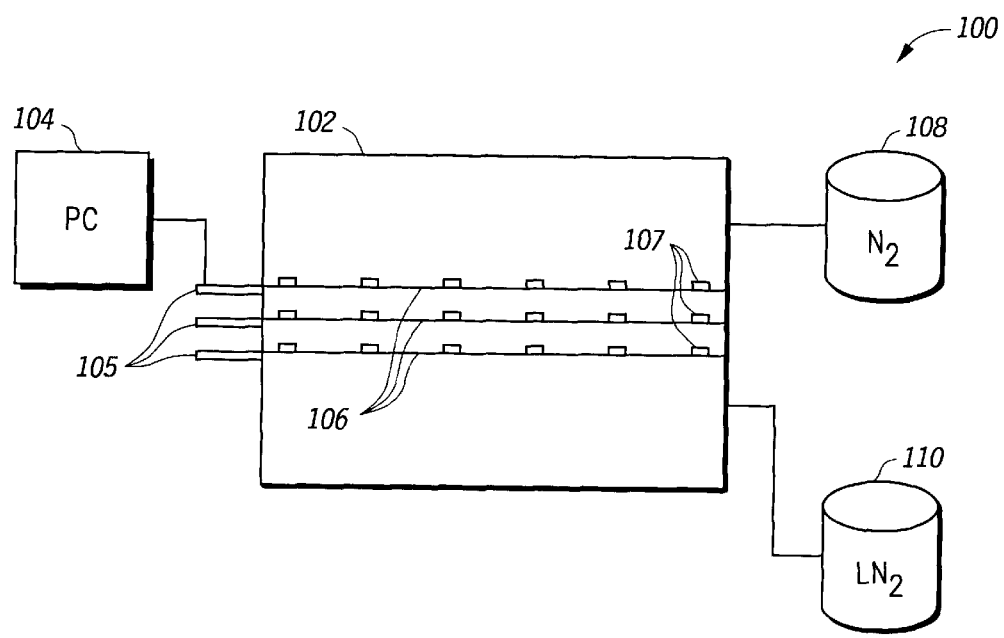
FIG. 1 illustrates an exemplary test system for chamber cycling wherein integrated circuits (ICs) are burned in and partially tested.

FIG. 1 illustrates an exemplary test system for chamber cycling 100 wherein ICs are burned in and partially tested. The test system for chamber cycling 100 includes a temperature cycling chamber (or unit) 102 which is partially controlled through a processor (typically a personal computer) 104. The processor 104 controls driver circuitry 105 to download information onto multiple ICs 107 to at least assist in performing a memory test protocol which includes but is not limited to logical and physical checkerboard patterns, program and erase margin reads, and block erase effect. The ICs 107 contain an electrically programmable memory portion referred to herein as flash memory. ICs 107, in a preferred embodiment, are microcomputers which further comprise a processing unit. Within the temperature cycling chamber 102 are a number of burn-in boards, hereinafter referred to as BIB 106. The BIB 106 includes the ICs 107. The BIB 106 could also be a wafer. As previously stated, the BIB 106 is located within the temperature cycling chamber 102. Dry nitrogen ($N_2$) 108 is attached to the temperature cycling chamber 102 and is used for purging the temperature cycling chamber 102 after a BIB or wafer 106 is placed inside the temperature cycling chamber 102. The dry nitrogen 108 purges the temperature cycling chamber 102 by removing the moisture that may be located therein.

The temperature cycling chamber 102, under control of the processor 104, passes the BIB 106 through three different temperatures. In one example, the first temperature is room temperature, which is approximately 25 degrees C. The next temperature is referred to as a hot temperature, which may be one hundred degrees Celsius (C.), but in a preferred embodiment is 125 degrees C. The third temperature is characterized as cold and is preferably negative 40 degrees C. The cold temperature is reached through the use of liquid nitrogen ($LN_2$) 110. Zero degrees Celsius may be considered a low temperature and provide an effective test, but minus 40 degrees Celsius provides a better test. The three temperatures or settings of the temperature cycling chamber 102 provide the ability to test all integrated circuits on the BIB 106 simultaneously.

Figure 2:
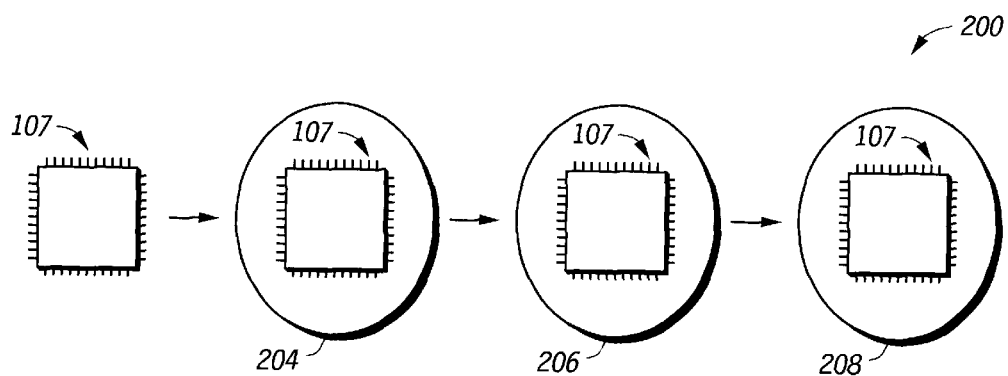
FIG. 2 illustrates an exemplary IC tester system for ICs that are tested with the test system for chamber cycling of FIG. 1.

FIG. 2 illustrates an exemplary integrated circuit (IC) testing system 200 for ICs that are tested with the test system for chamber cycling 100. The IC testing system 200 is illustrated as testing a single IC 107. The IC 107 is illustrated in numerous stages of the IC tester system 200 where additional memory test protocols and a processor test protocol are performed on the IC 107. An IC tester 204 performs specific functional testing of the IC 107 at room temperature. The IC 107 then passes to an IC tester 206 where the IC 107 is tested at hot temperatures. Finally, the IC 107 is passed to an IC tester 208 where functional testing is performed at cold temperatures. It should be noted that only one of the IC testers 204, 206, and 208 would be necessary where all ICs of the BIB 106 are passed through such single IC tester at one temperature and then passed through again at another temperature.

With the test system for chamber cycling 100 and the IC testing system 200, greater testing with an increased test coverage is performed in the test system for chamber cycling 100 which allows for expedited testing of each IC on the BIB 106 when it is passed through the IC tester system 200. In this manner, IC testing can be performed in parallel with a reduction in the time that was previously required to test IC chips. In other words, the IC 107 flash testing is done in batch mode instead of sequential mode. There is batch testing for the memory testing at three temperatures in cycling chamber 102 and then also tested, but at a much reduced quantity of tests, at the individual testers. So the testing and temperature cycling is in parallel.

The time that utilizes the more sophisticated testing equipment, done in testers such as testers 204, 206, and 208, which can only test a relatively small number of integrated circuits at a time, is done on a much smaller scale because most of the testing is done previously in temperature cycling chamber 102. The tests, both routine and sophisticated, must be run at cold temperature but most of the testing is accomplished with the whole batch of integrated circuits, then tested cold in relatively small numbers, for example, one at a time, in the more sophisticated equipment. The one at a time aspect is thus substantially reduced in time because most of the cold testing is done in a temperature cycling chamber. This results in more efficiency so that testers such as testers 204, 206, and 208, have a higher percentage of their time utilized for the sophisticated tests that they are uniquely qualified to run. Testers 204, 206, and 208 run tests not easily available to be run in batch form in temperature cycling chamber 102. Thus, testers 204, 206, and 208 must be utilized but the efficiency of testing is increased by getting much of the cold testing done prior to using the testers 204, 206, and 208. Testers 204, 206, and 208 are much more expensive than cycling chamber 102 and its accompanying test hardware. Adding many more testers such as testers 204, 206, 208, is potentially a way to reduce test time, but it is a very expensive alternative.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of testing an integrated circuit having a processing unit and an electrically programmable memory portion, comprising the steps of:
   performing a memory test protocol on the electrically programmable memory portion at substantially room temperature, a first cold temperature below zero degrees Celsius, and a first hot temperature above one hundred degrees Celsius; and
   after performing the memory test protocol, performing a processor test protocol on the processing unit at substantially room temperature, a second cold temperature below zero degrees Celsius, and a second hot temperature above one hundred degrees Celsius.

2. The method of claim 1, wherein the first cold temperature and the second cold temperature are about minus forty degrees Celsius.

3. The method of claim 2, wherein the first hot temperature and the second hot temperature are about one hundred twenty-five degrees Celsius.

4. The method of claim 3, wherein the memory test protocol comprises logical and physical checkerboard patterns, program and erase margin reads, and block erase effect.

5. The method of claim 4, wherein the memory test protocol is performed at least two times.

6. A method of testing a plurality of integrated circuits each having a processing unit and an electrically programmable memory portion, comprising the steps of:
   providing a temperature cycling unit;
   inserting the plurality of integrated circuits in the temperature cycling unit;
   cycling the temperature in the temperature cycling unit through substantially room temperature, a first hot temperature, and a first cold temperature;
   performing a memory test protocol on the plurality of integrated circuits during the temperature cycling;
   removing the plurality of integrated circuits from the temperature cycling unit;
   providing an integrated circuit testing system which includes one or more testers;
   inserting a first relatively small number of the plurality of integrated circuits into one of the one or more testers; and
   performing a processor test protocol on the first relatively small number of integrated circuits at a temperature selected from substantially room temperature, a second hot temperature, and a second cold temperature.

7. The method of claim 6, wherein the first cold temperature is about minus forty degrees Celsius.

8. The method of claim 7, wherein the first hot temperature is about one hundred twenty-five degrees.

9. The method of claim 8, wherein the second cold temperature is about minus forty degrees Celsius.

10. The method of claim 9, wherein the second hot temperature is about one hundred twenty-five degrees.

11. The method of claim 10, wherein the plurality of integrated circuits comprises more than one thousand and the relatively small number is less than or equal to thirty-two.

12. The method of claim 6, wherein the selected temperature is the cold temperature.

13. The method of claim 12, wherein the one or more testers comprises a first tester.

14. The method of claim 13, further comprising:
    removing the first relatively small number of integrated circuits from the first tester;
    inserting a second relatively small number of integrated circuits into the first tester; and
    performing the processor test protocol on the second relatively small number of integrated circuits at the second cold temperature.

15. The method of claim 14, further comprising:
    removing the second relatively small number of integrated circuits from the first tester;
    inserting a third relatively small number of integrated circuits into the first tester; and
    performing the processor test protocol on the second relatively small number of integrated circuits at the second hot temperature.

16. The method of claim 13, wherein the one or more testers further comprises a second tester.

17. The method of claim 16, further comprising
    removing the first relatively small number of integrated circuits from the first tester;
    inserting a second relatively small number of integrated circuits into the first tester;
    performing the processor test protocol on the second relatively small number of integrated circuits at the second cold temperature;

inserting the first relatively small number of integrated circuits into the second tester;

performing the processor test protocol on the first relatively small number of integrated circuits at the second hot temperature.

18. The method of claim 17, wherein the one or more testers further comprises a third tester.

19. The method of claim 18, further comprising removing the second relatively small number of integrated circuits from the first tester;

inserting a third relatively small number of integrated circuits into the first tester;

performing the processor test protocol on the third relatively small number of integrated circuits at the second cold temperature;

inserting the second relatively small number of integrated circuits into the second tester;

performing the processor test protocol on the second relatively small number of integrated circuits at the second hot temperature;

inserting the first relatively small number of integrated circuits into the third tester; and performing the processor test protocol on the first relatively small number of integrated circuits at substantially room temperature.

20. The method of claim 19, wherein the inserting of the first relatively small number of integrated circuits into the third tester occurs before the inserting of the first relatively small number of integrated circuits into the first tester.

* * * * *